(12) United States Patent
Mueller et al.

(10) Patent No.: US 11,094,868 B2
(45) Date of Patent: Aug. 17, 2021

(54) METHOD FOR PRODUCING AN ILLUMINATION DEVICE AND ILLUMINATION DEVICE

(71) Applicant: OSRAM Opto Semiconductors GmbH, Regensburg (DE)

(72) Inventors: Klaus Mueller, Pettendorf (DE); Holger Klassen, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/604,570

(22) PCT Filed: Apr. 10, 2018

(86) PCT No.: PCT/EP2018/059158
§ 371 (c)(1),
(2) Date: Oct. 11, 2019

(87) PCT Pub. No.: WO2018/189178
PCT Pub. Date: Oct. 18, 2018

(65) Prior Publication Data
US 2020/0127180 A1    Apr. 23, 2020

(30) Foreign Application Priority Data
Apr. 12, 2017  (DE) .................. 10 2017 107 961.0

(51) Int. Cl.
*H01L 23/00*     (2006.01)
*H01L 33/00*     (2010.01)
(Continued)

(52) U.S. Cl.
CPC ............. *H01L 33/62* (2013.01); *H01L 25/13* (2013.01); *H01L 2224/0401* (2013.01); *H01L 2224/13562* (2013.01); *H01L 2933/0066* (2013.01)

(58) Field of Classification Search
CPC ............. H01L 33/62; H01L 2224/0401; H01L 2224/13562; H01L 25/13
(Continued)

(56) References Cited

U.S. PATENT DOCUMENTS

| 2012/0119233 A1 | 5/2012 | Weidner et al. |
| 2014/0153238 A1* | 6/2014 | Nishimura .......... H01L 25/0753 362/237 |

(Continued)

FOREIGN PATENT DOCUMENTS

| DE | 102009036621 A1 | 2/2011 |
| DE | 102012213343 A1 | 1/2014 |

(Continued)

OTHER PUBLICATIONS

German Office Action based on application No. 10 2017 107 961.0 (4 pages) dated Sep. 3, 2019 (for reference purpose only).
(Continued)

*Primary Examiner* — David Vu
*Assistant Examiner* — Brandon C Fox
(74) *Attorney, Agent, or Firm* — Viering, Jentschura & Partner MBB (57) ABSTRACT

A method for producing an illumination device may include providing a plurality of optoelectronic semi-conductor components that each have a semi-conductor layer sequence for generating radiation where the semiconductor components each have at least one contact surface on one side and are held by a common carrier. The method may further include electroplating each contact surface of the semi-conductor components using a solder material, applying the semi-conductor components having the solder material to a substrate, and melting and soldering the contact surfaces onto the surfaces.

14 Claims, 5 Drawing Sheets

(51) Int. Cl.
  *H01L 33/62* (2010.01)
  *H01L 25/13* (2006.01)
(58) Field of Classification Search
  USPC .......................................................... 257/98
  See application file for complete search history.

(56) References Cited

U.S. PATENT DOCUMENTS

| | | |
|---|---|---|
| 2015/0099316 A1 | 4/2015 | Ryu et al. |
| 2015/0137162 A1 | 5/2015 | Sabathil et al. |
| 2016/0027759 A1 | 1/2016 | Plößl |
| 2016/0155892 A1* | 6/2016 | Li .......................... H01L 24/95 257/89 |
| 2017/0069796 A1 | 3/2017 | Lin et al. |
| 2018/0114878 A1* | 4/2018 | Danesh ............... H01L 33/0095 |
| 2019/0319163 A1* | 10/2019 | Schuele ............. H01L 33/0093 |

FOREIGN PATENT DOCUMENTS

| | | |
|---|---|---|
| DE | 102013103081 A1 | 10/2014 |
| EP | 0354114 A1 | 2/1990 |
| EP | 2328192 A2 | 6/2011 |
| WO | 2004068573 A1 | 8/2004 |

OTHER PUBLICATIONS

German Search Report based on application No. 10 2017 1007 961.0 (7 pages) dated Oct. 25, 2017 (for reference purpose only).
International Search Report based on application No. PCT/EP2018/ 059158 (3 pages + 3 pages English Translation) dated Jul. 6, 2018 (for reference purpose only).
Mackie A.; "Reflow of Copper Pillar Microbumps"; Indium Corporation; Jun. 10, 2013; 2 pages.

* cited by examiner

METHOD FOR PRODUCING AN ILLUMINATION DEVICE AND ILLUMINATION DEVICE

CROSS-REFERENCE TO RELATED APPLICATIONS

The present application is a national stage entry according to 35 U.S.C. § 371 of PCT application No.: PCT/EP2018/059158 filed on Apr. 10, 2018; which claims priority to German patent application 10 2017 107 961.0 filed on Apr. 12, 2017; both of which are incorporated herein by reference in their entirety and for all purposes.

TECHNICAL FIELD

The present invention relates to a method for producing an illumination apparatus and an illumination apparatus.

BACKGROUND

It is desirable to specify a method for producing an illumination apparatus that makes simple and reliable production possible. It is furthermore desirable to specify an illumination apparatus that is simple to produce.

SUMMARY

The illumination apparatus is for example an apparatus having a plurality of optoelectronic semiconductor components. The optoelectronic semiconductor components are for example in each case an optoelectronic semiconductor chip that emits radiation during operation. For example, the semiconductor chip may be a light-emitting diode chip or a laser diode chip. The optoelectronic semiconductor components can in each case produce in particular light during operation. The illumination apparatus is for example a headlight in a motor vehicle or is usable in a headlight, in particular a front headlight, for a motor vehicle.

The optoelectronic semiconductor components according to at least one embodiment in each case have a semiconductor layer sequence for producing radiation. The semiconductor layer sequence in particular has an active layer for producing radiation between a first and a second semiconductor region. For example, the first semiconductor region is an n-type semiconductor region and the second semiconductor region is a p-type semiconductor region. The n-type semiconductor region is configured to be n-conductive. The p-type semiconductor region is configured to be p-conductive. During operation of the optoelectronic semiconductor components, electromagnetic radiation is produced in each case in the active region, for example. The electromagnetic radiation is produced here by recombining charge carriers. The semiconductor layer sequence is based for example on a nitride compound semiconductor material. Further semiconductor materials are also possible. The semiconductor layer sequence is in particular an epitaxially grown semiconductor layer sequence.

The optoelectronic semiconductor components in each case have at least one contact area on a side. The contact area during operation serves for making electric and/or mechanical contact with the optoelectronic semiconductor component. In particular, depending on the semiconductor component, two contact areas are provided on the side.

The plurality of optoelectronic semiconductor components is held by a common carrier. The carrier can also be referred to as a frame. The carrier is made of a plastics material, for example. The plurality of optoelectronic semiconductor components is cast, in particular molded, into the carrier. For example, the carrier holds at least three optoelectronic semiconductor components. It is also possible to hold more semiconductor components, in particular a matrix of n×m semiconductor components is held by the carrier.

By way of example, the common carrier is singulated from a plastics frame, also referred to as a wafer. The plastics frame holds for example 100 optoelectronic semiconductor components or more. It is also possible for fewer than 100 optoelectronic semiconductor components to be held by the common carrier. The plastics frame serves in particular for holding and transporting the plurality of optoelectronic semiconductor components and for example does not provide any electrical connection or similar infrastructure necessary during operation.

According to one embodiment, the respective contact area of the semiconductor components is galvanically coated with a soldering material. On account of the galvanic deposition, a uniform coating of the respective contact area with soldering material is possible. Using the galvanic coating it is possible to define very accurately what quantity of the soldering material is in each case applied onto the contact area. In addition, the soldering material during the galvanic coating deposits only on the contact areas that are made in particular of metal. No soldering material is deposited on the carrier that is for example made of plastics material during the galvanic coating. It is thus possible to apply a thin layer of soldering material onto the respective contact areas, wherein the amount of soldering material corresponds in each case very exactly to specifications. In non-limiting embodiments, all of the plurality of optoelectronic semiconductor components are galvanically coated simultaneously.

The semiconductor components in accordance with one embodiment are applied onto a substrate using the soldering material. The substrate is for example a component that carries and mechanically stabilizes the finished illumination device. For example, the substrate is made of a ceramic material such as aluminum nitride or a semiconductor material such as silicon. Circuit boards or metal core boards can likewise be used as a substrate. The finished illumination device is contactable for example externally electrically and mechanically via the substrate. Dissipation of any heat developing during operation by the substrate is also possible.

The soldering material according to one embodiment is melted. The melting is effected in particular using heat above the melting point of the soldering material used.

According to at least one embodiment, the contact areas are soldered onto the substrate. The contact areas of the plurality of optoelectronic semiconductor components are in each case connected electrically and mechanically to the substrate using soldering, such that the optoelectronic semiconductor components are in each case electrically and mechanically fixed to the substrate.

According to one embodiment, a method for producing an illumination device comprises providing a plurality of optoelectronic semiconductor components having in each case a semiconductor layer sequence for producing radiation. The semiconductor components in each case have at least one contact area on a side. The optoelectronic semiconductor components are held by a common carrier. The respective contact area of the semiconductor components is galvanically coated with a soldering material. The semiconductor components are applied onto a substrate with the soldering material. The soldering material is melted and the contact areas are soldered onto the substrate.

A production method described here is based among other things on the following considerations. When mounting optoelectronic component arrays using soldering with a high number of contact areas, typically a tilting of the light-emitting surfaces occurs. In addition, flux residues which are difficult to remove occur between the connections. In non-limiting embodiments, for small chip sizes, for example below 500 μm edge length, the electric contact areas become correspondingly smaller. Arrays having a plurality of optoelectronic semiconductor components for illumination devices, for example in motor vehicles as adaptive light of a headlight, are for example constructed by soldering individual conventional optoelectronic semiconductor components together with other electronic components onto a substrate with a conventional SMT technique. Height differences and tilting of the individual semiconductor components can occur here, which can be compensated for by complicated primary optical units. In addition, the minimally possible distance between the light-emitting faces with respect to one another is limited.

The production method described here now takes advantage among other things of the idea that galvanically applied soldering material is used. The starting point is standardized LED base arrays in which a matrix of optoelectronic semiconductor components is held by the molded or cast carrier. The optoelectronic semiconductor components in each case can be configured as flip chips. The carrier is for example embodied as a molded or cast wafer, from which the carrier with the plurality of optoelectronic semiconductor components is sawn.

The contact areas on the underside, also referred to as connections, of these basic building blocks are provided with soldering material using galvanic methods. The soldering material used is for example a nearly eutectic tin silver solder. On account of the galvanic application, an accurately defined solder quantity is made available at each contact area, that is to say at each component connection. Hereby, undesired tilting of the plurality of optoelectronic semiconductor components during the solder operation is consequently avoided.

The LED base arrays thus provided, that is to say the plurality of optoelectronic semiconductor components having galvanically coated contact areas that are held by the common carrier can be placed onto a suitable substrate in subsequent steps using die bonders. Subsequently, the substrate is transported to the soldering station, wherein the optoelectronic semiconductor components are held such that they do not slide out of place or do so as little as possible. Subsequently, the solder depots are melted, as a result of which the contact areas are soldered onto the substrate.

According to embodiments, after the soldering process a suitable underfill is applied under the optoelectronic semiconductor components for the purposes of mechanical stabilization and aging stability.

The exactly defined solder volumes make the reliable joining even of small contact areas with very narrow distances possible. On account of the exactly defined solder quantity, the optoelectronic semiconductor components and the base arrays are hardly able to tilt. The optoelectronic semiconductor components and the base arrays after melting of the soldering material float to the associated substrate contact areas. Consequently, the semiconductor components are able to be placed very exactly on the substrate because they align themselves owing to the surface tension of the soldering material.

It is possible to place a plurality of base arrays next to one another, wherein the outer base arrays can initially be placed with a greater distance, for example on account of the placing accuracy of the die bonder. During the soldering operation, the outer base arrays float into a narrow distance on account of the surface tension of the solder. In this way, self-centering is made possible. The loss of material during singulation of the base arrays from the wafer provides the placing clearance for a total array with a constant distance of the light-emitting faces of the semiconductor components beyond the boundaries of the base array. Due to the parallelized mounting, a higher number of pieces per hour is possible with lower costs. The mounting of the electronic components described results in high coplanarity of all light-emitting faces with respect to the substrate. Consequently, conversion elements can be subsequently applied, for example differently colored ceramic converter plates. Alternatively or additionally, contrast-enhancing or beenshaping elements can subsequently be mounted, for example gratings.

According to at least one embodiment, an adhesive is applied onto the soldering material before the melting of the soldering material. In this way, the semiconductor components are fixed to the substrate. In non-limiting embodiments, the semiconductor components are held by the adhesive on the substrate in order to be transported to the soldering station. Adhesives used are for example triethanolamine (TEA) and/or a mixture of glycerol and isopropanol.

According to at least one embodiment, the adhesive is evaporated before the melting of the soldering material. That means the adhesive is initially evaporated by heating to under or above its boiling point. Once the adhesive has been removed, the soldering material is melted.

According to at least one embodiment, the adhesive is evaporated at a first temperature. The soldering material is melted at a second temperature. The first temperature is lower than the second temperature. In this way, reliable controlling of the removal of the adhesive before the melting of the soldering material is possible.

According to at least one embodiment, the substrate is introduced into a soldering chamber together with the applied semiconductor components before the melting of the soldering material. A gaseous flux is introduced into the soldering chamber before the melting of the soldering material. The gaseous flux is in particular a reducing gas mixture. For example, a gaseous flux used is nitrogen enriched with formic acid. In this way, any oxides present on the galvanically deposited soldering material are removed.

According to at least one embodiment, a vacuum is produced in the soldering chamber during melting of the soldering material. The soldering chamber is sufficiently evacuated so that any gas inclusions that may be present can be removed from the soldering material.

According to at least one embodiment, the respective contact areas are coated with the soldering material having a thickness of 2 to 20 μm. In non-limiting embodiments, the soldering material is applied onto the respective contact areas with a thickness of between 5 and 15 μm, for example between 3 and 5 μm. Due to the galvanic application of the soldering material, the thickness is very exactly controllable and thinly specifiable.

According to at least one embodiment, the soldering material is melted slightly before the semiconductor components are applied onto the substrate. In this way, an outer shape of the soldering material is reshaped. For example, the soldering material is applied with a first outer shape by the galvanic coating. By the slight melting, this outer shape is changed to form a second outer shape. For example, the first outer shape has edges and the second outer shape is rounded.

According to at least one embodiment, the substrate is provided with the metallic substrate contact areas. The metallic substrate contact areas are heated such that the soldering material and the metallic substrate contact areas form an intermetallic bond. In this way, the contact areas are soldered to the substrate. Consequently, no solder by itself is left after the soldering. This simplifies further processing because the connection between the semiconductor components and the substrate does not already melt at the melting temperature of the soldering material but only at a higher temperature. The components and the substrate are connected to one another by way of isothermal solidification. For example, the metallic substrate contact areas have copper and/or nickel gold, which subsequently forms the intermetallic bond with the soldering material.

The substrate contact areas according to at least one embodiment are heated using pressure and the soldering material is thereby melted. Part of the substrate contact area is thus also melted. This forms an intermetallic bond.

Furthermore specified is an illumination device. The illumination device is in particular produced with the production method according to the application according to at least one embodiment. Accordingly, all features and advantages disclosed for the method are also disclosed for the illumination device, and vice versa.

According to at least one embodiment, the illumination device has a substrate. The substrate serves in particular for carrying components and/or for making electric contact.

According to least one embodiment, the illumination device has a plurality of optoelectronic semiconductor components. The optoelectronic semiconductor components are for example in each case light-emitting diode chips. The latter in each case have a semiconductor layer sequence with an active zone for producing radiation, such as visible light such as blue light.

The semiconductor components in each case have a surface, in particular light is emitted on the surface during operation. The semiconductor components are in each case arranged on the substrate.

According to one embodiment, a galvanically applied solder layer is arranged between a respective contact area of the semiconductor components and the substrate. The solder layer connects the semiconductor components and the substrate. Due to the fact that the solder layer was galvanically applied during the production of the illumination device, a specifically defined solder quantity is provided.

The surfaces of the semiconductor components that face away from the substrate are aligned in planar fashion with respect to one another. The galvanically applied solder layer makes avoidance of height differences and tilting of the individual semiconductor components with respect one another possible. Consequently, semiconductor components are aligned in planar fashion with respect one another. The surfaces of the semiconductor components are aligned in planar fashion with respect one another in particular within specified tolerances.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

Elements that are identical, of the same type or of the same effect can be provided with the same reference signs across all figures. The figures are not true to scale.

DETAILED DESCRIPTION

Figure 1:
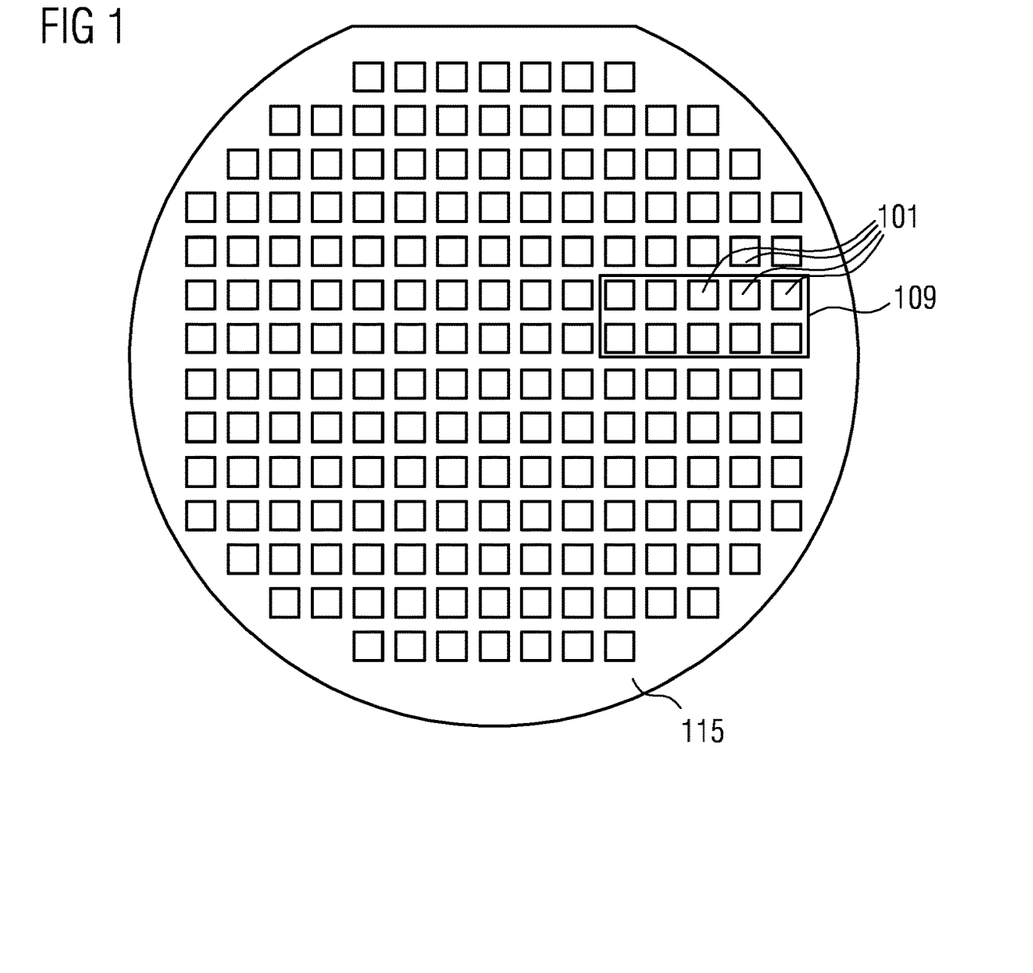
FIGS. 1 to 6 show different method steps of a production method of an illumination device according to a non-limiting embodiment.

FIG. 1 shows a plastics frame 115, for example a molded or cast wafer. The plastics frame 150 holds a multiplicity of optoelectronic semiconductor components 101. In non-limiting embodiments, several 10 to more than 100 optoelectronic semiconductor components are held by the plastics frame 115.

Figure 4A:
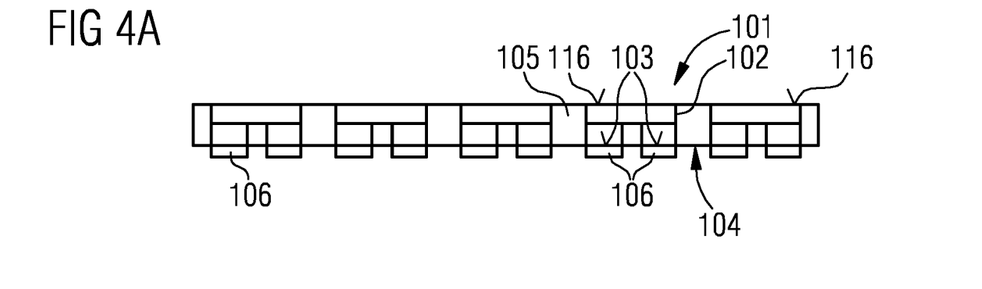
Figure 4B:
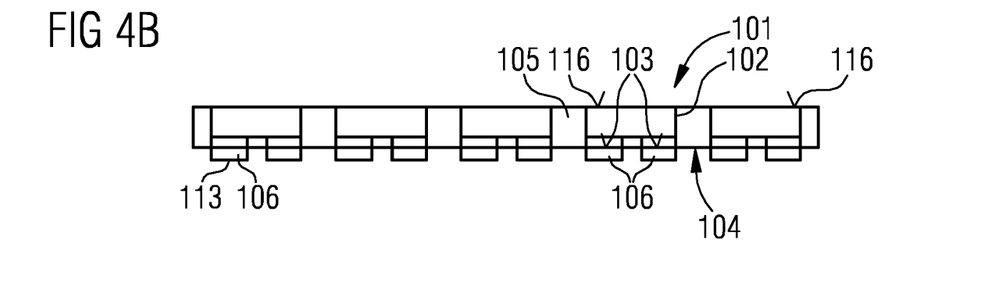

The optoelectronic semiconductor components 101 in each case have in particular a semiconductor layer sequence, in particular what is known as a thin-film semiconductor layer sequence. The semiconductor layer sequence is in particular an epitaxially grown semiconductor layer sequence 102 (FIGS. 4A and 4B).

The semiconductor layer sequence 102 in each case has an active layer between a first semiconductor region and a second semiconductor region. For example, the first semiconductor region is a p-doped layer. The second semiconductor region is for example an n-doped layer.

When applying voltage during operation, the active layer produces electromagnetic radiation, for example in the visible range, in the UV range or in the infrared range. The optoelectronic semiconductor components 101 are in particular in each case light-emitting diodes (LEDs).

A plurality of arrays 109 having in each case a plurality of optoelectronic semiconductor components 101 are sawn from the plastics frame 115 with the optoelectronic semiconductor components 101. Other singulation methods are also possible. The method according to the application will furthermore be explained below using the example of an array 109.

Figure 2:
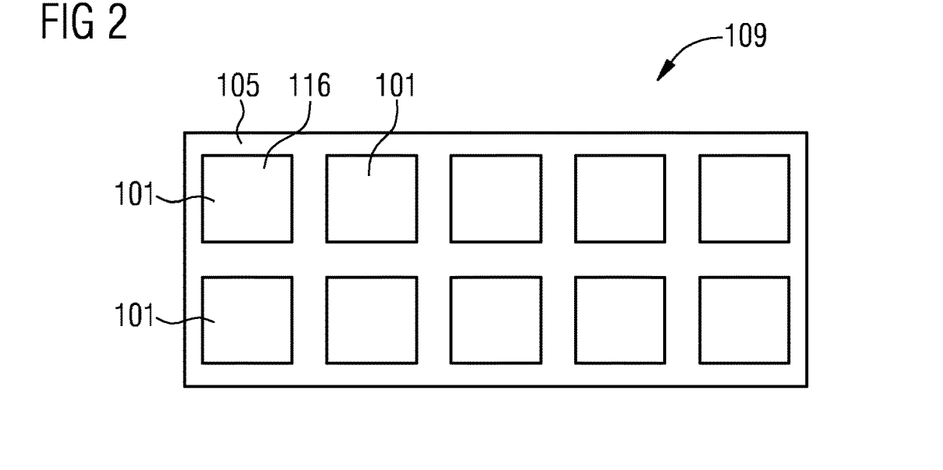

FIG. 2 shows the array 109 after the singulation from the plastics frame 115. The array 109, also referred to as a matrix, has the plurality of optoelectronic semiconductor components 101. The array 109 for example has at least three optoelectronic semiconductor components. In the exemplary embodiment shown, the array 109 has a matrix of 2×5 semiconductor components 101. Other arrangements with more or fewer semiconductor components 101 are also possible, for example a matrix having 3×3 semiconductor components 101.

The semiconductor components 101 of the array 109 are held by a common carrier 105, also referred to as a frame. The carrier 105 is made for example from plastics material. The carrier 105 was in particular part of the plastics frame 115 before the singulation.

FIG. 2 additionally shows a surface 116 of the semiconductor components 101 from which radiation is emitted during operation.

Figure 3:
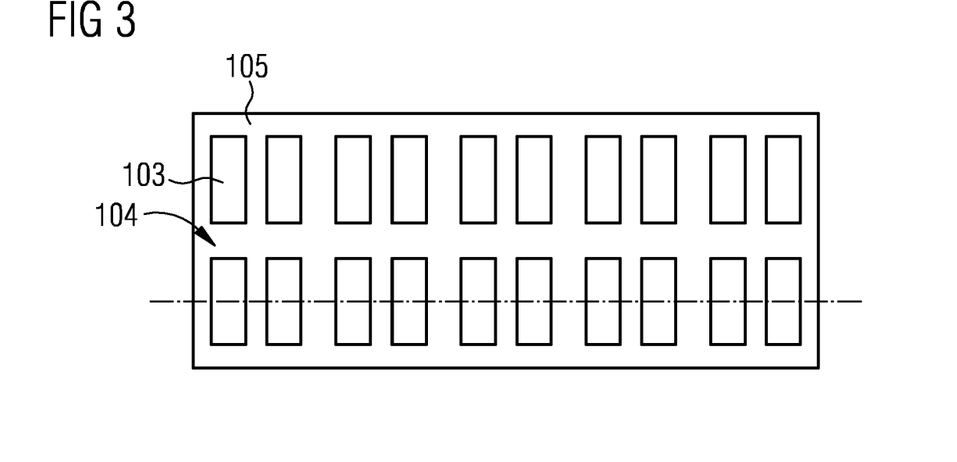

FIG. 3 shows an underside 104 of the optoelectronic semiconductor components 101 opposite the surface 116, said semiconductor components 101 being held by the carrier 105. Each semiconductor component 101 in the exemplary embodiment illustrated has on the side 104 two contact areas 103. The latter subsequently serve for electronic contacting in particular of the semiconductor layer sequence 102. The contact areas 103 include for example copper and/or nickel.

FIGS. 4A and 4B show exemplary embodiments of the semiconductor components 101 in the carrier 105 in a sectional view.

FIG. 4A shows surface-emitting semiconductor components 101. FIG. 4B shows volume-emitting semiconductor components 101.

Independently of the configuration of the semiconductor layer sequence 102, a soldering material 106 is galvanically applied onto the contact areas 103 in accordance with FIGS. 4A and 4B. Using galvanic technology, also referred to as electroplating or galvanic plating, the soldering material 106 is applied onto the contact areas 103. The soldering material is for example tin silver (SnAg). Other soldering materials can also be used.

The soldering material 106 is applied only onto the metallic contact areas 103. During the deposition of the soldering material 106, the soldering material does not adhere to the carrier 105, which is not electrically conductive.

Figure 5:
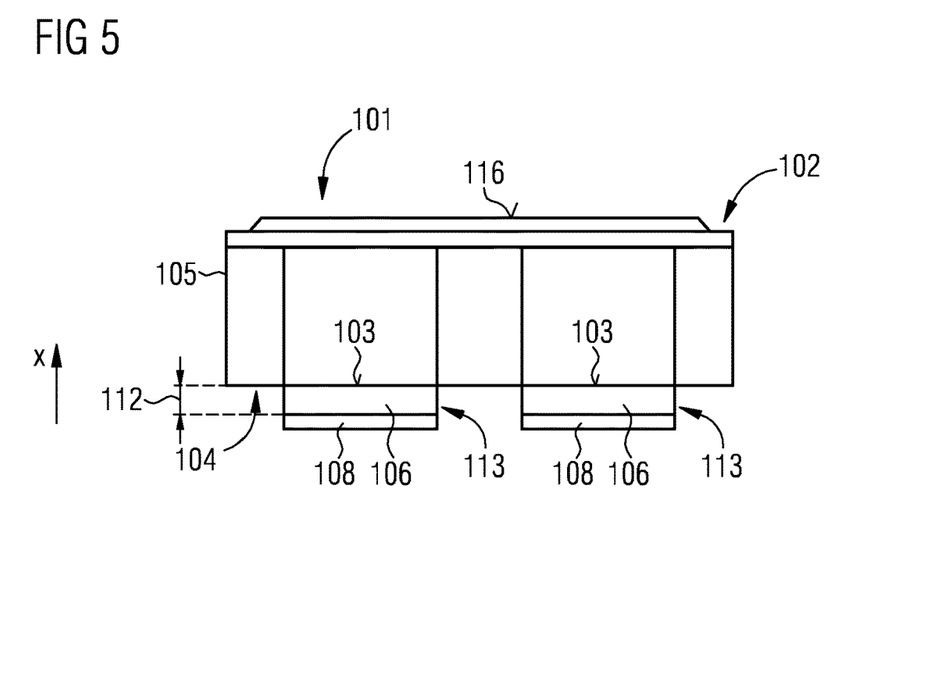

As is illustrated in more detail in FIG. 5, the soldering material 106 is applied with a thickness 112, which is in particular between 2 and 20 μm. In non-limiting embodiments, the thickness 112 ranges between 5 and 15 μm, for example between 10 and 15 μm or thinner, for example between 3 and 5 μm. The thickness 112 is measured in particular along the stack direction of the semiconductor component 101. The stack direction corresponds to the x-direction in FIG. 5.

FIG. 5 shows a detailed view of an individual component 101 in the carrier 105. The remaining components 101 in the carrier 105 of the array 109 are constructed in the same way. The individual semiconductor components 101 have an edge length transversely to the x-direction of less than 1 mm, for example less than 500 μm.

On account of the application of the soldering material 106 by way of galvanic deposition, the solder quantity on each connection face 103 is definable to be of the same size and in particular accurate within narrow tolerances. Uncertainties as occur when applying solder pastes can thus be reduced or excluded. The exact solder quantity that is present on each contact area 103 results from the size of the contact area 103 and the defined thickness 112 of the soldering material 106.

During the galvanic deposition of the soldering material, for example soldering materials 106 having an edge-type cuboid outer shape 113, as illustrated, are obtained. By way of an intermediate step in which the soldering material 106 is slightly melted after the application, for example rounded outer contours are obtained.

After the galvanic deposition of the soldering material 106, an adhesive 108, also referred to as temporary adhesive medium, is applied onto the soldering material 106. In non-limiting embodiments, the adhesive 108 is applied over the whole surface both onto the soldering material 106 and onto the carrier 105. According to further exemplary embodiments, the adhesive 108 is applied only onto the soldering material 106, either over the whole area or only partially. According to further exemplary embodiments, the adhesive 108 is applied only onto the carrier 105 and not onto the soldering material 106. The adhesive 108 is for example stamped on. The adhesive is alternatively or additionally dispensed. Alternatively or additionally, the adhesive 108 is sprayed on. Alternatively or additionally, the adhesive 108 is jetted on. The adhesive 108 contains for example triethanolamine (TEA) or a mixture of glycerol and isopropanol. Other suitable adhesive materials can also be used.

Figure 6:
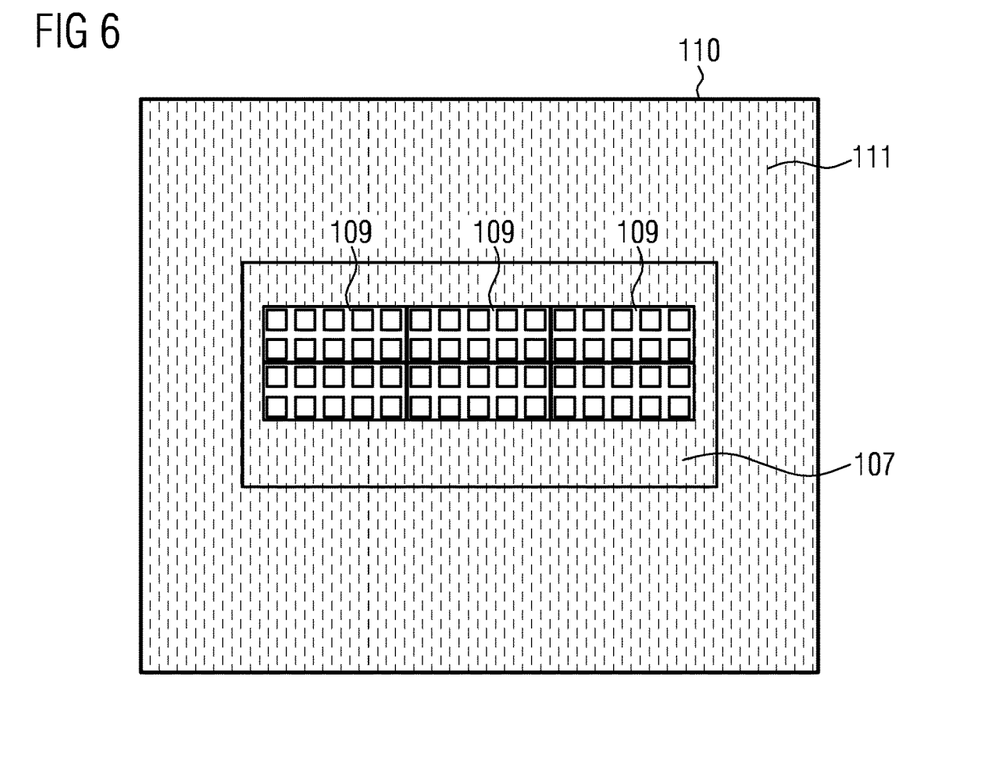

Using a die bonder, the array 109 is applied with the adhesive 108 onto a substrate 107 (FIG. 6). The array 109 is held on the substrate 107 with the adhesive 108.

In this way, transport to a soldering chamber 110 (FIG. 6) is possible without the array 109 being able to slide out of place on the substrate 107. In non-limiting embodiments, a plurality of arrays 109 are placed onto a common substrate 107, as is illustrated in FIG. 6.

In the subsequent soldering process, initially the temporary adhesive medium 106 is evaporated by heating below or above its boiling point. In non-limiting embodiments, the boiling point of the adhesive 108 lies under the melting point of the soldering material 106. For example, the adhesive evaporates at 130° C. In this way, the adhesive 108 is removed without melting the soldering material 108.

Subsequently, a reducing gas mixture is fed into the soldering chamber 110 as gaseous flux 111. For example, nitrogen enriched with formic acid is introduced into the soldering chamber 110 to remove any oxides present on the galvanically deposited soldering material 106.

Next, the soldering material 106 is melted, for example at 260° C. or more. According to exemplary embodiments, a vacuum is produced here in the soldering chamber 110 to remove any gas inclusions present from the soldering material 106.

After soldering, according to exemplary embodiments, a suitable underfill is additionally applied for mechanical stabilization and aging stability between the array 109 and the substrate 107.

Figure 7:
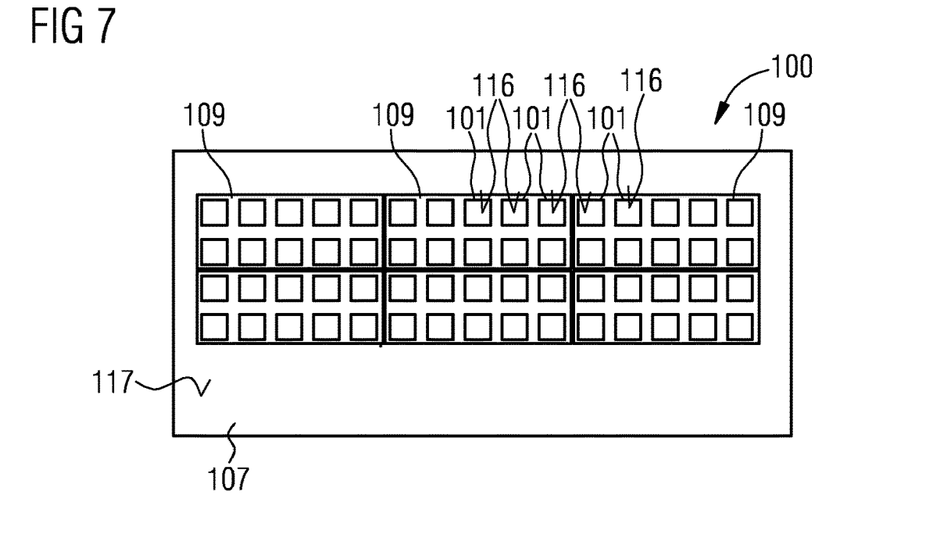
FIG. 7 shows an illumination device according to a non-limiting embodiment.

FIG. 7 shows an illumination device 100 according to one exemplary embodiment, which was produced by a production method according to the application. A plurality of arrays 109 is arranged on a surface 117 of the common substrate 107. The substrate 107 makes available electrical contacts, heat dissipation or other infrastructure necessary during operation such as control intelligences.

Owing to the exactly defined volumes of the soldering material 106 on the contact areas 103, very close distances of the arrays 109 with respect to one another are possible. The semiconductor components 101 within an array 109 cannot tilt with respect to one another. On account of the exactly defined solder quantity and the low-pore embodiment in a vacuum solder process, the arrays 109 do not tilt with respect to one another either or only insignificantly. Owing to the surface tension of the soldering material 106, the arrays 109 self-center and can in particular be placed initially at a greater distance and then move toward one another during the soldering. The surfaces 116 of the optoelectronic semiconductor components 101 within an array 109 and also of the neighboring arrays 109 are plane with respect one another. On account of the use of the gaseous flux 111, no flux residues need to be taken into account that could negatively impact the aging behavior for example due to electromigration or loss of light due to discoloration of the residues and/or the planarity.

The soldering material 106 according to exemplary embodiments remains between the carrier 105 and the substrate 107, such that a certain degree of flexibility is maintained. Self-centering makes possible very close distances between the individual arrays 109 of the illumination device 100. In non-limiting embodiments, conventional substrates 107 can be used. Owing to the use of the gaseous flux 111, no cleaning step, as in conventional flux, needs to be carried out. The high coplanarity of the surfaces 116 subsequently makes the arrangement of optical elements or conversion elements possible. For example, ceramic converter plates are placed onto the surfaces 116. Contrast-enhancing or beam-shaping elements such as frames or lenses can also be applied. Due to the sawing of the arrays 109 from the plastics frame 115, material of the plastics frame 115 is consumed. This makes possible a tolerance in the accuracy of the arrangement of the array 109 on the substrate 107.

Figure 8:
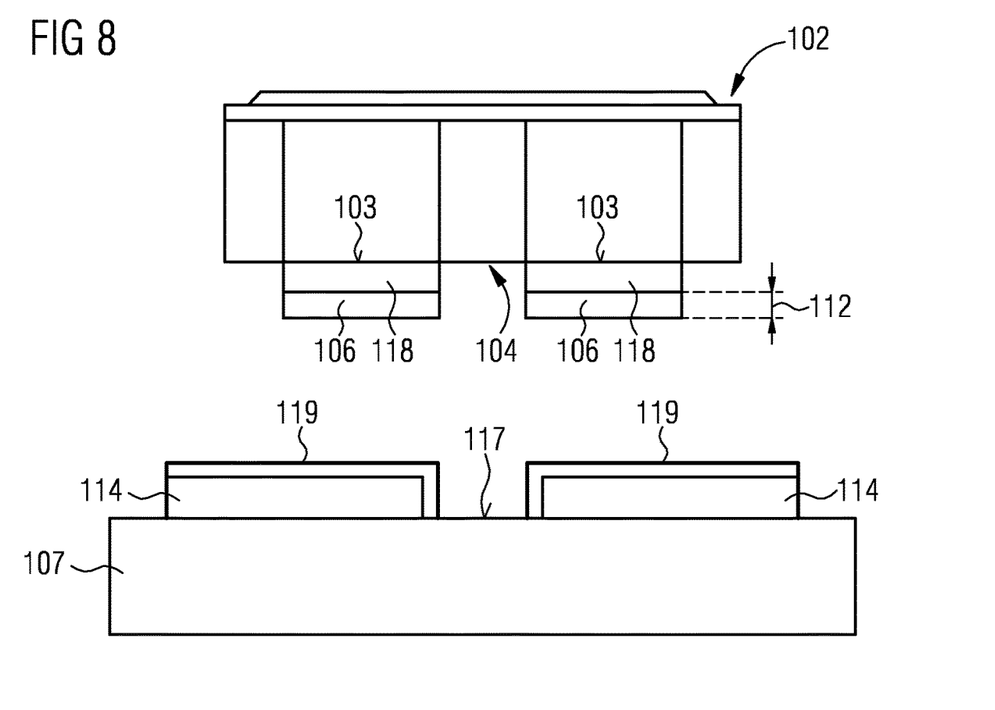
FIGS. 8 and 9 show different method steps of a production method of an illumination device according to a non-limiting embodiment.
Figure 9:
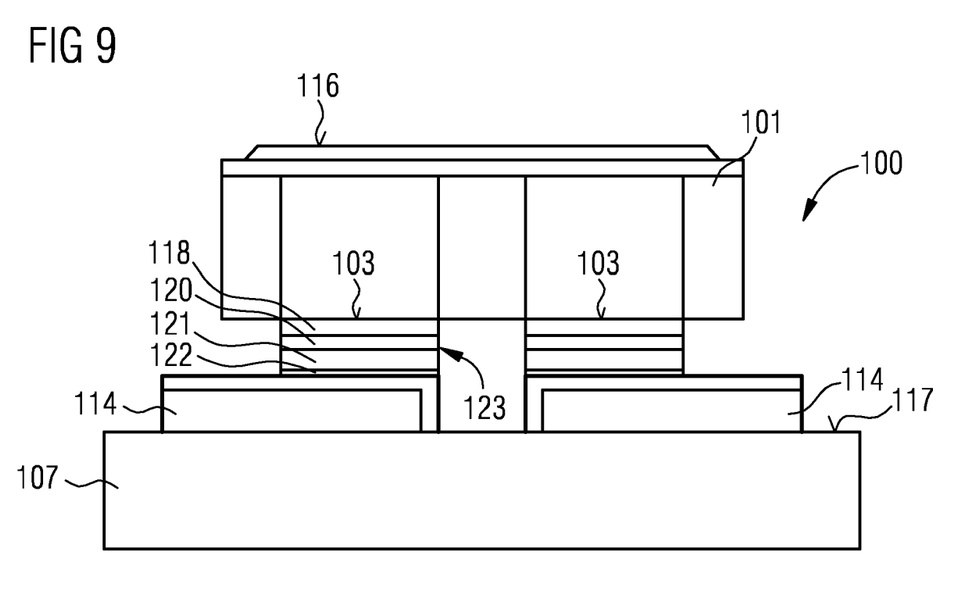

FIGS. 8 and 9 show a further exemplary embodiment of the solder connection of the array 109 to the substrate 107.

Initially, a copper layer 118 and subsequently the soldering material 106 are applied on the contact area 103. The soldering material 106 is galvanically applied onto the copper layer 118, as already explained, in particular with the thickness 112 of between 3 and 5 µm.

The substrate 107 has substrate contact areas 114. The substrate contact areas 114 serve for electric and/or mechanical connection to the contact areas 113 of the semiconductor component 101. The substrate contact areas 114 according to the exemplary embodiment of FIGS. 8 and 9 are provided with a termination layer 119. The latter for example includes copper and/or nickel gold.

After soldering, in particular the materials of the termination layer 119 and the soldering material 106 form an intermetallic bond 123. For example, the soldering material 106 and the termination layer 119 are heated, in particular using a heated tool that also exerts pressure. In this way, a first layer 120 containing or consisting of in particular $Cu_3Sn$ is formed between the copper layer 118 and the substrate 107.

Below it, a second layer 121 is formed, which contains or consists of $(Cu, Ni, Au)_6Sn_5$. Below it, a third layer 122 is formed which contains or consists of $(Ni, Cu)_xSn_y$. The intermetallic bond 123 thus formed is also referred to as isothermal solidification and connects the optoelectronic semiconductor component 101, or the array 109, to the substrate 107.

The soldering material 106 according to the exemplary embodiment of FIGS. 8 and 9 is used up completely. Consequently, the illumination device 100 is particularly resistant to heat and can in subsequent process steps also be subjected to further melting soldering processes (also referred to as reflow soldering). In addition, surface mountability (SMD) is made possible. The accuracy in the alignment of the arrays 109 on the substrate 107 in this exemplary embodiment is specified by the accuracy during the die bonding.

Overall, an illumination device 100 is producible that can be used in particular for vehicles, for example for adaptive front headlights. The soldering mounting of the optoelectronic flip chip arrays 109 with the high number of contact areas 103 is possible without tilting of the surfaces 116 and without leaving flux residues that are hard to remove between the connections. In this way, even small semiconductor components 101 with edge lengths of under 500 µm can be reliably mounted on the substrate 107.

The invention is not limited by the description using the exemplary embodiments to the latter. Rather, the invention comprises each new feature and each combination of features, which in particular includes every combination of features in the patent claims, even when this feature or this combination itself is not explicitly specified in the patent claims or exemplary embodiments.

LIST OF REFERENCES

100 illumination device
101 optoelectronic semiconductor component
102 semiconductor layer sequence
103 contact area
104 side
105 carrier
106 soldering material
107 substrate
108 adhesive
109 array
110 soldering chamber
111 gaseous flux
112 thickness
113 outer shape
114 substrate contact areas
115 plastics frame
116 surface of the semiconductor components
117 surface of the substrate
118 copper layer
119 termination layer
120 first layer
121 second layer
122 third layer
123 intermetallic bond

The invention claimed is:

1. A method for providing an illumination device, comprising:
   providing a plurality of optoelectronic semiconductor components comprising a semiconductor layer sequence for producing radiation, wherein the semiconductor components comprise at least one contact area on a side and are held by a common carrier;
   galvanically coating the respective contact area of the semiconductor components with a soldering material;
   applying the semiconductor components onto a substrate with the soldering material;
   melting the soldering material; and
   soldering the contact areas onto the substrate.

2. The method as claimed in claim 1, further comprising:
   applying an adhesive onto the soldering material before melting, and to secure the semiconductor components on the substrate.

3. The method as claimed in claim 2, further comprising:
   evaporating the adhesive before the melting of the soldering material.

4. The method as claimed in claim 3, further comprising:
   evaporating the adhesive at a first temperature; and
   melting the soldering material at a second temperature, wherein the first temperature is lower than the second temperature.

5. The method as claimed in claim 1, further comprising:
   introducing the substrate together with the applied semiconductor components into a soldering chamber before the melting of the soldering material; and
   introducing a gaseous flux into the soldering chamber before the melting of the soldering material.

6. The method as claimed in claim 5, wherein nitrogen enriched with formic acid is introduced as the gaseous flux.

7. The method as claimed in claim 1, further comprising:
   producing a vacuum in the soldering chamber during the melting of the soldering material.

8. The method as claimed in claim 1, wherein the soldering material comprises tin.

9. The method as claimed in claim 1, further comprising:
coating the respective contact areas with the soldering material with a thickness of 2 to 20 μm.

10. The method as claimed in claim 1, further comprising:
slightly melting the soldering material before applying the semiconductor components onto the substrate; and
reshaping the outer shape of the soldering material.

11. The method as claimed in claim 1, further comprising:
providing the substrate with metallic substrate contact areas;
applying the semiconductor components with the soldering material onto the metallic substrate contact areas;
heating the metallic substrate contact areas such that the soldering material and the metallic substrate contact areas form an intermetallic bond; and
soldering the contact areas onto the substrate.

12. The method as claimed in claim 11, wherein:
the metallic substrate contact areas comprise copper and/or nickel gold.

13. The method as claimed in claim 11, further comprising:
heating the substrate contact areas and melting the soldering material using pressure.

14. The method as claimed in claim 1, wherein:
the common carrier comprises a plastics frame.

* * * * *